US012120917B2

(12) United States Patent
Wang

(10) Patent No.: US 12,120,917 B2
(45) Date of Patent: Oct. 15, 2024

(54) DISPLAY PANEL AND MOBILE TERMINAL

(71) Applicant: WUHAN CHINA STAR OPTOELECTRONICS SEMICONDUCTOR DISPLAY TECHNOLOGY CO., LTD., Wuhan (CN)

(72) Inventor: Wei Wang, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 0 days.

(21) Appl. No.: 17/600,069

(22) PCT Filed: Aug. 31, 2021

(86) PCT No.: PCT/CN2021/115819
§ 371 (c)(1),
(2) Date: Sep. 29, 2021

(87) PCT Pub. No.: WO2023/015622
PCT Pub. Date: Feb. 16, 2023

(65) Prior Publication Data
US 2024/0046861 A1 Feb. 8, 2024

(30) Foreign Application Priority Data
Aug. 12, 2021 (CN) .......................... 202110925159.4

(51) Int. Cl.
H10K 59/121 (2023.01)
G09G 3/3233 (2016.01)
H10K 59/126 (2023.01)

(52) U.S. Cl.
CPC ....... *H10K 59/1213* (2023.02); *G09G 3/3233* (2013.01); *H10K 59/1216* (2023.02);
(Continued)

(58) Field of Classification Search
CPC ............. H10K 59/126; H10K 59/1213; H10K 59/123; H10K 59/1216; G09G 3/3233;
(Continued)

(56) References Cited

U.S. PATENT DOCUMENTS

2016/0370621 A1* 12/2016 Huang .................. G02F 1/1368
2019/0081090 A1* 3/2019 Lee ....................... H10K 59/126
(Continued)

FOREIGN PATENT DOCUMENTS

CN 106847931 A 6/2017
CN 107369690 A 11/2017
(Continued)

OTHER PUBLICATIONS

Chinese Office Action issued in corresponding Chinese Patent Application No. 202110925159.4 dated Apr. 19, 2022, pp. 1-9.
(Continued)

Primary Examiner — Xuemei Zheng
(74) Attorney, Agent, or Firm — PV IP PC; Wei Te Chung

(57) ABSTRACT

A display panel and a mobile terminal are disclosed in the present disclosure. The display panel includes a substrate and a pixel driving circuit layer. The pixel driving circuit layer includes a plurality of pixel driving circuits, and each of the pixel driving circuits at least includes a compensation transistor and a shielding component. An orthogonal projection of the shielding component projected on the substrate at least partially overlaps an orthogonal projection of the compensation transistor projected on the substrate, so that the compensation transistor is not affected by a potential of
(Continued)

the substrate, thereby enhancing the reliability of currents of the pixel driving circuits.

20 Claims, 7 Drawing Sheets

(52) U.S. Cl.
CPC ... *H10K 59/126* (2023.02); *G09G 2320/0233* (2013.01); *G09G 2320/043* (2013.01)

(58) Field of Classification Search
CPC ..... G09G 2320/045; G09G 2320/0233; G09G 2320/043; G09G 3/3208
See application file for complete search history.

(56) References Cited

U.S. PATENT DOCUMENTS

| | | | |
|---|---|---|---|
| 2021/0066421 A1* | 3/2021 | Son | H10K 59/1201 |
| 2021/0305284 A1* | 9/2021 | He | H01L 29/66757 |
| 2021/0359066 A1* | 11/2021 | An | H01L 27/124 |

FOREIGN PATENT DOCUMENTS

| | | |
|---|---|---|
| CN | 107664891 A | 2/2018 |
| CN | 110875363 A | 3/2020 |
| CN | 110992880 A | 4/2020 |
| CN | 111584587 A | 8/2020 |
| CN | 112071268 A | 12/2020 |
| CN | 112951891 A | 6/2021 |
| JP | H05267692 A | 10/1993 |

OTHER PUBLICATIONS

International Search Report in International application No. PCT/CN2021/115819, mailed on Apr. 26, 2022.

Written Opinion of the International Searching Authority in International application No. PCT/CN2021/115819, mailed on Apr. 26, 2022.

* cited by examiner

DISPLAY PANEL AND MOBILE TERMINAL

RELATED APPLICATIONS

This application is a Notional Phase of PCT Patent Application No. PCT/CN2021/115819 having international filing date of Aug. 31, 2021, which claims the benefit of priority of Chinese Patent Application No. 202110925159.4 filed on Aug. 12, 2021. The contents of the above applications are all incorporated by reference as if fully set forth herein in their entirety.

FIELD OF INVENTION

The present disclosure relates to the field of display technology, and more particularly, to a display panel and a mobile terminal.

BACKGROUND OF INVENTION

With the development of display technology, organic light-emitting diode (OLED) display devices are more and more widely used. Compared with liquid crystal displays, OLED displays have the advantages of low energy consumption, low production costs, self-illumination, wide viewing angles, and high response speed. At present, in the field of flat panel displays, such as mobile phones, PDAs, and digital cameras, OLED displays have begun to replace the conventional liquid crystal displays (LCD), wherein the design for pixel circuits is the core technology of OLED displays, which has important research significance.

The OLED display includes a pixel driving circuit. The pixel driving circuit includes a plurality of thin film transistors (TFTs), wherein the stability of the characteristics of the thin film transistors is a key factor that affects the quality of the OLED display. However, in the prior art, due to the reasons, such as the ionic pollution introduced during manufacturing the display panel, inadequate static protection, and variation in the characteristics of the screen material, voltages applied to the circuit device may change, which may cause the substrate to induce charges, so as to result in the change of the threshold voltage of the thin film transistor. As a result, the OLED display has some problems such as poor uniformity of brightness and chroma, residual image on the screen, and a short lifespan of the device.

SUMMARY OF INVENTION

Technical Problem

A display panel and a mobile terminal are disclosed in embodiments of the present disclosure to improve the stability of brightness and chroma of the display panel.

Technical Solutions

In order to achieve the aforementioned function, the technical solutions are disclosed in the embodiments of the present disclosure as below.

A display panel is disclosed in the embodiments of the present disclosure, wherein the display panel includes a substrate and a pixel driving circuit layer disposed on the substrate. The pixel driving circuit layer includes a plurality of pixel driving circuits, and each of the pixel driving circuits at least includes a compensation transistor;
wherein the display panel further includes a shielding component disposed between the substrate and the compensation transistor, and an orthogonal projection of the shielding component projected on the substrate at least partially overlaps an orthogonal projection of the compensation transistor projected on the substrate.

In the display panel disclosed in the embodiments of the present disclosure, the compensation transistor includes a first semiconductor layer located on the substrate, a first gate layer located on the first semiconductor layer, and a first source/drain layer located on the first gate layer;
wherein the shielding component includes a first shielding layer disposed between the substrate and the first semiconductor layer.

In the display panel disclosed in the embodiments of the present disclosure, a material of the shielding component is one of amorphous silicon, monocrystalline silicon, polycrystalline silicon, or oxide.

In the display panel disclosed in the embodiments of the present disclosure, an orthogonal projection of the first shielding layer projected on the substrate covers an orthogonal projection of the first semiconductor layer projected on the substrate.

In the display panel disclosed in the embodiments of the present disclosure, the shielding component further includes a first insulating layer, a second shielding layer, and a second insulating layer which are located between the first shielding layer and the first semiconductor layer, and an orthogonal projection of the second shielding layer projected on the substrate overlaps an orthogonal projection of the first shielding layer projected on the substrate.

In the display panel disclosed in the embodiments of the present disclosure, a material of the shielding component is an electrical conductive material; wherein the first shielding layer receives a constant potential.

In the display panel disclosed in the embodiments of the present disclosure, the display panel further includes a light-emitting function layer located on the pixel driving circuit layer, wherein the pixel driving circuit layer further includes a second thin film transistor electrically connected with the light-emitting function layer;
wherein the light-emitting function layer includes an anode, a light-emitting layer, and a cathode which are stacked; the second thin film transistor and the compensation transistor are spaced apart from each other, the second thin film transistor includes a second semiconductor layer, a second gate layer, and a second source/drain layer which are located on the substrate, and the second source/drain layer is electrically connected with the anode;
wherein the display panel further includes a reset metal line located between the second gate layer and the second source/drain layer, a constant high-level voltage metal line disposed on the same layer with the second source/drain layer, a constant low-level voltage metal line disposed on the same layer with the first gate layer, and a bridge component, wherein one terminal of the bridge component is disposed on the same layer with and electrically connected with one of the reset metal line, the constant high-level voltage metal line, and the constant low-level voltage metal line, and another terminal of the bridge component is electrically connected with the first shielding layer.

In the display panel disclosed in the embodiments of the present disclosure, the compensation transistor is a dual-gate structure, the first gate layer includes a first gate and a second gate disposed on a same layer and spaced apart from each other, orthogonal projections of the first gate and the second gate projected on the first semiconductor layer are both located in an orthogonal projection of the first shielding layer projected on the first semiconductor layer, and the first shielding layer is electrically connected with at least one of the first gate and the second gate.

In the display panel disclosed in the embodiments of the present disclosure, the first semiconductor layer includes a first channel region corresponding to the first gate and a second channel region corresponding to the second gate, and a sum of a width of the first channel region and a width of the second channel region is greater than or equal to 5 microns.

In the display panel disclosed in the embodiments of the present disclosure, the width of the second channel region is ⅕ to ⅘ of the width of the first channel region.

In the display panel disclosed in the embodiments of the present disclosure, the display panel further includes a plurality of light-emitting units disposed in an array, the pixel driving circuits drive the light-emitting units to emit light, and one of the pixel driving circuits includes a first initialization transistor, a switching transistor, a driving transistor, the compensation transistor, a second initialization transistor, a first light-emitting control transistor, a second light-emitting control transistor, and a first capacitor;
wherein a gate of the driving transistor is connected with a first node, a first terminal of the driving transistor is connected with a third node, and a second terminal of the driving transistor is connected with a second node;
wherein a gate of the switching transistor is connected to receive a second scan signal, a first terminal of the switching transistor is connected to receive a data signal, and a second terminal of the switching transistor is connected with the second node;
wherein a gate of the compensation transistor is connected to receive the second scan signal, a first terminal of the compensation transistor is connected with the third node, and a second terminal of the compensation transistor is connected with the first node;
wherein a gate of the first initialization transistor is connected to receive a first scan signal, a first terminal of the first initialization transistor is connected to receive a first initialization signal, and a second terminal of the first initialization transistor is connected with the first node;
wherein a gate of the first light-emitting control transistor is connected to receive a light-emitting control signal, a first terminal of the first light-emitting control transistor is connected with a fifth node, a second terminal of the first light-emitting control transistor is connected with the second node, and the first light-emitting control transistor is connected to receive a high-potential power signal line through the fifth node;
wherein a gate of the second light-emitting control transistor is connected to receive the light-emitting control signal, a first terminal of the second light-emitting control transistor is connected with the third node, and a second terminal of the second light-emitting control transistor is connected with a fourth node;
wherein a gate of the second initialization transistor is connected to receive the second scan signal, a first terminal of the second initialization transistor is connected with the fourth node, and a second terminal of the second initialization transistor is connected to receive the first initialization signal;
wherein a first capacitor electrode of the first capacitor is connected with the fifth node, a second capacitor electrode of the first capacitor is connected with the first node, and the first capacitor is connected with a first power supply line through the fifth node, wherein the first power supply line is the constant high-level voltage metal line;
wherein an anode of one of the light-emitting units is connected with the fourth node, and a cathode of the one of the light-emitting units is connected with a second power supply line;
wherein the shielding component is at least located between the substrate and one of the first initialization transistor, the switching transistor, the compensation transistor, the second initialization transistor, the first light-emitting control transistor, and the second light-emitting control transistor.

A mobile terminal is further disclosed in the embodiments of the present disclosure, wherein the mobile terminal includes a display panel and a terminal body. The terminal body and the display panel are combined into one. The display panel includes a substrate and a pixel driving circuit layer disposed on the substrate. The pixel driving circuit layer includes a plurality of pixel driving circuits, and each of the pixel driving circuits at least includes a compensation transistor;
wherein the display panel further includes a shielding component disposed between the substrate and the compensation transistor, and an orthogonal projection of the shielding component projected on the substrate at least partially overlaps an orthogonal projection of the compensation transistor projected on the substrate.

In the mobile terminal disclosed in the embodiments of the present disclosure, the compensation transistor includes a first semiconductor layer located on the substrate, a first gate layer located on the first semiconductor layer, and a first source/drain layer located on the first gate layer;
wherein the shielding component includes a first shielding layer disposed between the substrate and the first semiconductor layer.

In the mobile terminal disclosed in the embodiments of the present disclosure, a material of the shielding component is one of amorphous silicon, monocrystalline silicon, polycrystalline silicon, or oxide.

In the mobile terminal disclosed in the embodiments of the present disclosure, an orthogonal projection of the first shielding layer projected on the substrate covers an orthogonal projection of the first semiconductor layer projected on the substrate.

In the mobile terminal disclosed in the embodiments of the present disclosure, the shielding component further includes a first insulating layer, a second shielding layer, and a second insulating layer which are located between the first shielding layer and the first semiconductor layer, and an orthogonal projection of the second shielding layer projected on the substrate covers an orthogonal projection of the first semiconductor layer projected on the substrate.

In the mobile terminal disclosed in the embodiments of the present disclosure, a material of the shielding component is an electrical conductive material; wherein the first shielding layer receives a constant potential.

In the mobile terminal disclosed in the embodiments of the present disclosure, the display panel further includes a light-emitting function layer located on the pixel driving circuit layer, and the light-emitting function layer includes an anode, a light-emitting layer, and a cathode which are stacked;
wherein the pixel driving circuit layer further includes a second thin film transistor electrically connected with the light-emitting function layer, the second thin film transistor and the compensation transistor are spaced apart from each other, the second thin film transistor comprises a second semiconductor layer, a second gate layer, and a second source/drain layer which are located on the substrate, and the second source/drain layer is electrically connected with the anode;

wherein the display panel further includes a reset metal line located between the second gate layer and the second source/drain layer, a constant high-level voltage metal line disposed on the same layer with the second source/drain layer, a constant low-level voltage metal line disposed on the same layer with the first gate layer, and a bridge component, wherein one terminal of the bridge component is disposed on the same layer with and electrically connected with one of the reset metal line, the constant high-level voltage metal line, and the constant low-level voltage metal line, and another terminal of the bridge component is electrically connected with the first shielding layer.

In the mobile terminal disclosed in the embodiments of the present disclosure, the compensation transistor is a dual-gate structure, the first gate layer includes a first gate and a second gate disposed on a same layer and spaced apart from each other, orthogonal projections of the first gate and the second gate projected on the first semiconductor layer are both located in an orthogonal projection of the first shielding layer projected on the first semiconductor layer, and the first shielding layer is electrically connected with at least one of the first gate and the second gate.

In the mobile terminal disclosed in the embodiments of the present disclosure, the first semiconductor layer comprises a first channel region corresponding to the first gate and a second channel region corresponding to the second gate, and a sum of a width of the first channel region and a width of the second channel region is greater than or equal to 5 microns.

Beneficial Effects

A display panel and a mobile terminal are disclosed in the embodiments of the present disclosure. The display panel includes a substrate and a pixel driving circuit layer disposed on the substrate. The pixel driving circuit layer includes a plurality of pixel driving circuits, and each of the pixel driving circuits at least includes a compensation transistor. The display panel further includes a shielding component disposed between the substrate and the compensation transistor. An orthogonal projection of the shielding component projected on the substrate at least partially overlaps an orthogonal projection of the compensation transistor projected on the substrate. By disposing the shielding component between the compensation transistor and the substrate, the compensation transistor is not affected by a potential of the substrate, so that the reliability of the characteristics of the thin film transistor is improved, thereby enhancing the stability of the currents of the pixel driving circuits.

DETAILED DESCRIPTION OF PREFERRED EMBODIMENTS

A display panel and a mobile terminal are disclosed in the present disclosure. In order to make the purpose, technical solution and effect of the present disclosure clearer and more definite, the present disclosure is further described in detail with reference to the attached drawings and embodiments. It should be understood that the specific embodiments described herein are only used to explain the present disclosure and the present disclosure is not limited thereto.

Figure 1:
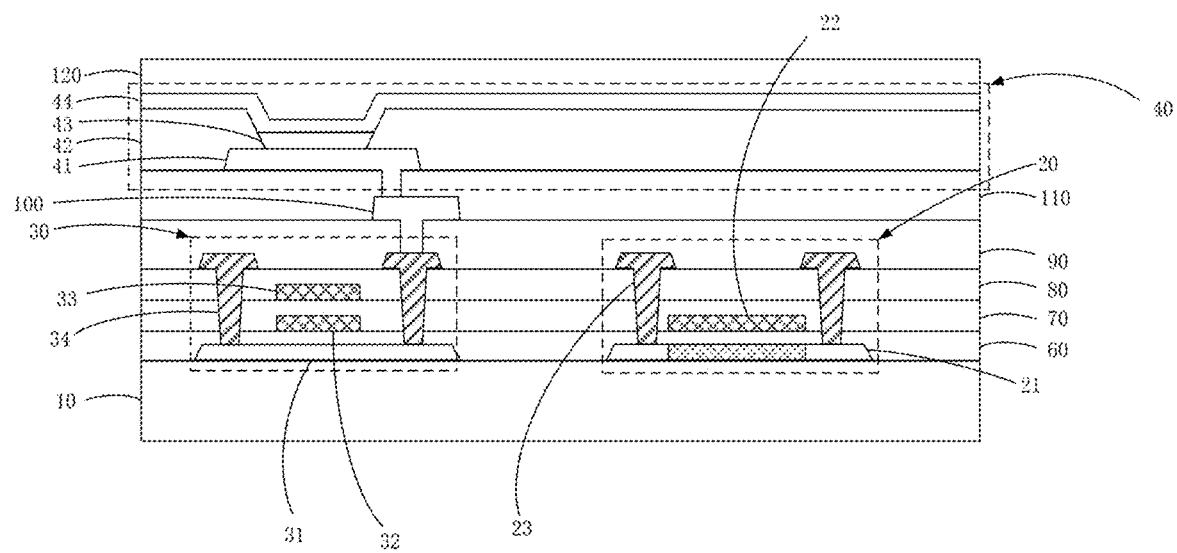
FIG. 1 is a schematic structural diagram of a display panel in the prior art.
Figure 2:
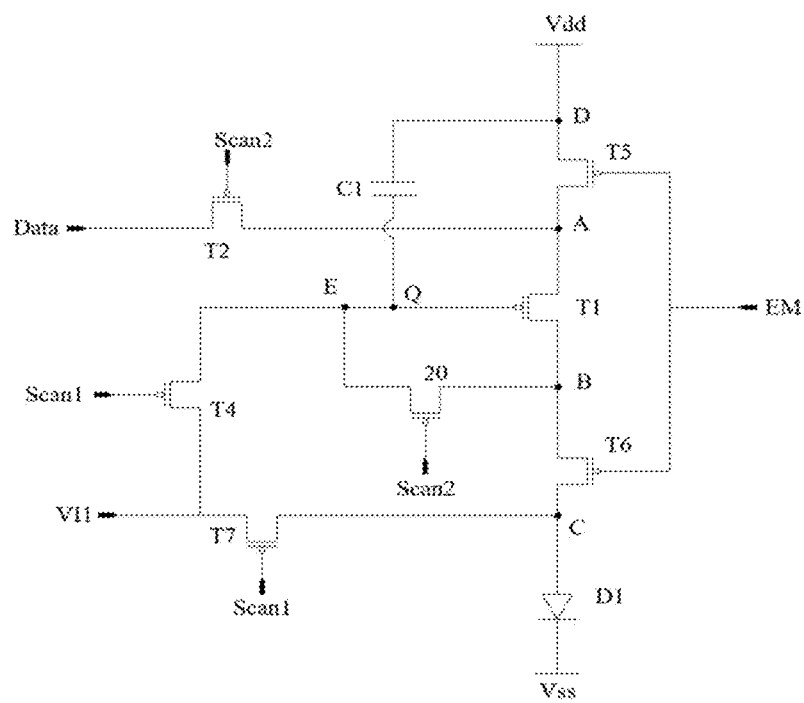
FIG. 2 is a schematic structural diagram of a pixel driving circuit of a display panel in the prior art.

References are made to FIG. 1 and FIG. 2. FIG. 1 is a schematic structural diagram of a display panel in the prior art, and FIG. 2 is a schematic structural diagram of a pixel driving circuit of the display panel in the prior art.

In the prior art, the display panel includes a substrate 10, a pixel driving circuit layer (not marked in the figure), a light-emitting function layer 40, and a packaging layer 120 which are stacked. The pixel driving circuit layer includes a plurality of pixel driving circuits, and each of the pixel driving circuits includes a compensation transistor 20 and a second thin film transistor 30 which are disposed on the substrate 10 and spaced apart from each other. The second thin film transistor 30 is electrically connected with the light-emitting function layer 40. The compensation transistor 20 includes a first semiconductor layer 21 located on the substrate 10, a first gate layer 22 located above the first semiconductor layer 21, and a first source/drain layer 23 located above the first gate layer 22. The second thin film transistor 30 includes a second semiconductor layer 31 located on the substrate 10, a second gate layer 32 located above the second semiconductor layer 31, and a second source/drain layer 34 located above the second gate layer 32. The first semiconductor layer 21 is an oxide semiconductor layer, and the second semiconductor layer 31 is a polysilicon semiconductor layer.

The pixel driving circuit further includes a light-emitting unit D1, a first initialization transistor T4, a switching transistor T2, a driving transistor T1, a compensation transistor 20, a second initialization transistor T7, a first light-emitting control transistor T5, a second light-emitting control transistor T6, and a first capacitor Cst. The second thin film transistor 30 is a driving transistor T1, and is configured to drive the light-emitting unit to emit light under the controls of the voltages of the first node Q(E) and the second node A. The compensation transistor 20 is connected to the driving transistor T1 through the first node Q (E) and the third node B, and is configured to compensate the threshold voltage of the driving transistor T1 under the control of the second scanning signal scan2.

However, in the prior art, due to the reasons such as the ionic pollution introduced during manufacturing the display panel, inadequate static protection, and variation in the characteristics of the screen material, the voltages applied to the circuit device may change, which may cause the substrate 10 to induce charges, so as to result in the change of the threshold voltage of the thin film transistor. As a result, the OLED display has some problems, such as poor uniformity of brightness and chroma, residual images on the screen, and a short lifespan of the device. Accordingly, the embodiments of the present disclosure disclose a display panel to improve the stability of brightness and chroma of the display panel.

References are made to FIG. 3A to FIG. 7. The embodiments of the present disclosure provide a display panel. The display panel includes a substrate 10 and a pixel driving circuit layer (not marked in the figure) disposed on the substrate 10. The pixel driving circuit layer includes a plurality of pixel driving circuits, and each of the pixel driving circuit includes at least a compensation transistor 20. The display panel further includes a shielding component 50 disposed between the substrate 10 and the compensation transistor 20, and an orthogonal projection of the shielding component 50 projected on the substrate 10 at least partially overlaps an orthogonal projection of the compensation transistor 20 projected on the substrate 10.

In the embodiment of the present disclosure, the shielding component 50 is disposed between the compensation transistor 20 and the substrate 10, so that the compensation transistor 20 is not affected by the potential of the substrate 10, thereby improving the stability of the current of the pixel driving circuit.

The technical solutions of the present disclosure are described in combination with specific embodiments.

Figure 3A:
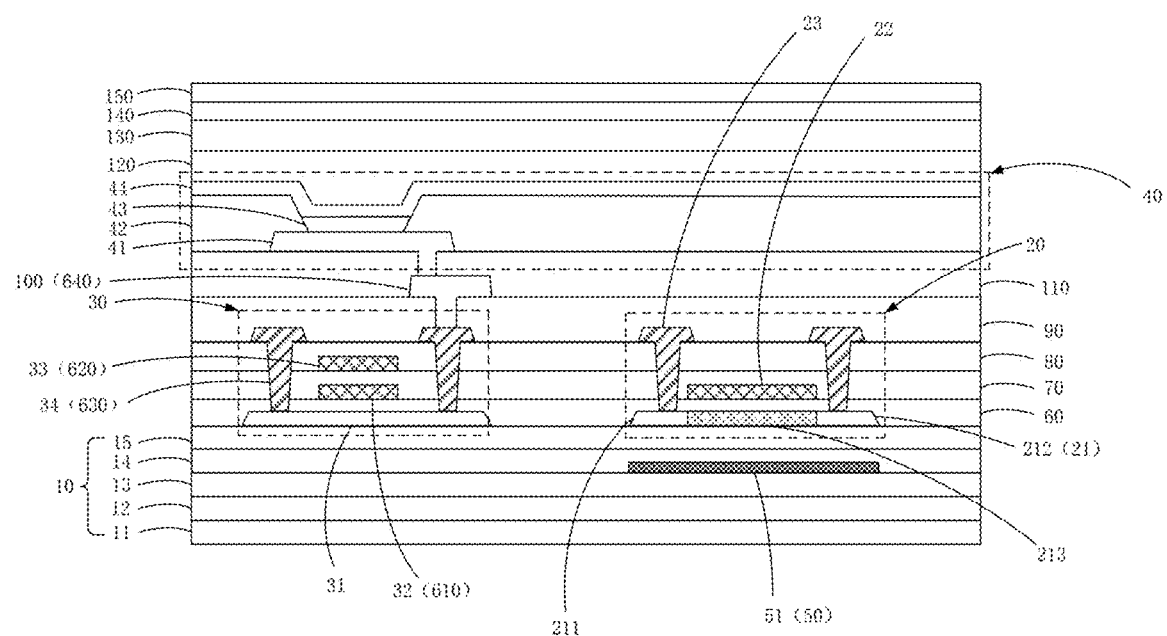
FIG. 3A to FIG. 3B are first schematic structural diagrams of a display panel disclosed in the embodiments of the present disclosure.
Figure 3B:
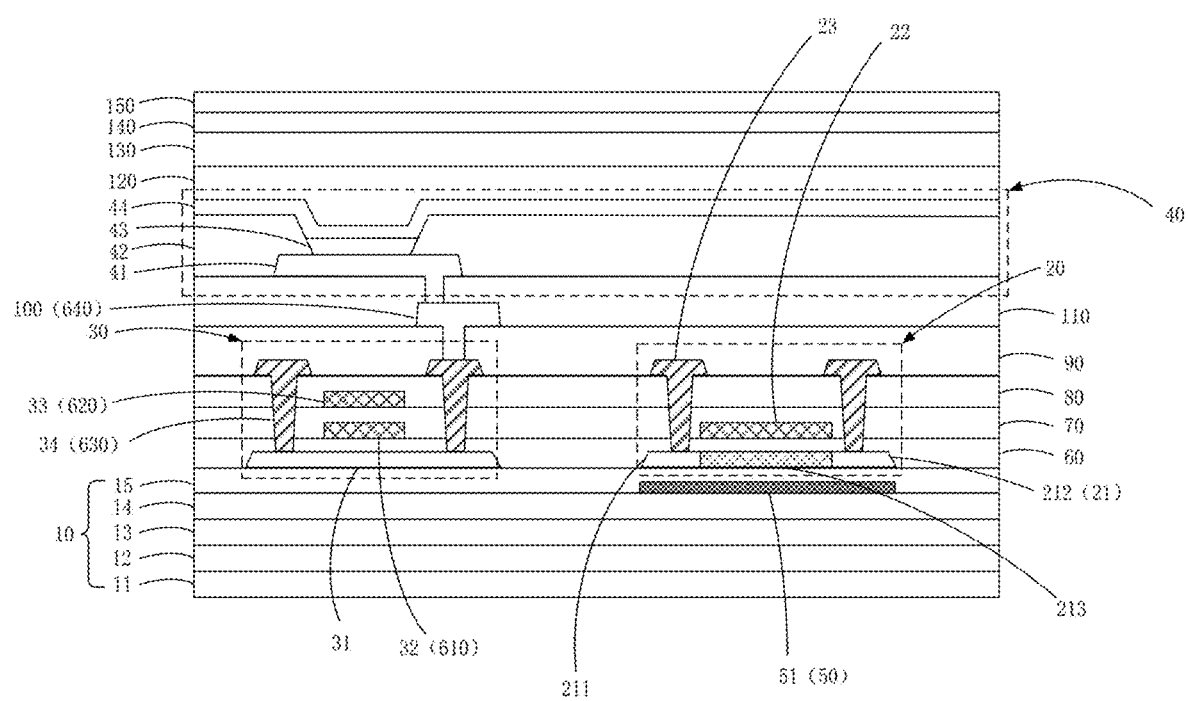

References are made to FIG. 3A to FIG. 3B. A first schematic structural diagram of the display panel is disclosed in the embodiments of the present disclosure.

In the present embodiment, the display panel includes a substrate 10 and a pixel driving circuit layer (not marked in the figure) disposed on the substrate 10. The pixel driving circuit layer includes a plurality of pixel driving circuits, wherein the pixel driving circuit can be realized with a plurality of thin film transistors (TFTs) and formed above the substrate 10. It can be understood that the thin film transistors can be realized by an oxide semiconductor TFTs or a polysilicon (Si) semiconductor TFTs. An appropriate type of TFT that satisfies the required standards such as leakage current, switching speed, driving strength, and uniformity may be used in such a pixel driving circuit, so as to enhance the display performance.

In the present embodiment, the substrate 10 may include a rigid substrate or a flexible substrate. When the substrate 10 is the rigid substrate, the material thereof may be metal or glass. When the substrate 10 is the flexible substrate, the material thereof may include at least one of acrylic resin, methacrylic resin, polyisoprene, vinyl resin, epoxy resin, polyurethane resin, cellulose resin, siloxane resin, polyimide resin, and polyamide resin. The material of the substrate 10 is not limited in the present embodiment.

In the present embodiment, the substrate 10 is the flexible substrate, and includes a first flexible substrate 11, a barrier layer 12, a second flexible substrate 13, a first buffer layer 14, and a second buffer layer 15 which are stacked, wherein the materials of the first flexible substrate 11 and the second flexible substrate 13 may include at least one of polyimide, polyethylene terephthalate, polyethylene naphthalate, polycarbonate, polyarylate, and polyethersulfone. The material of the barrier layer 12 usually is silicon oxide (SiOx). The first buffer layer 14 and the second buffer layer 15 may include inorganic material, such as at least one of silicon nitride or silicon oxide, to prevent external impurities under the substrate 10 from permeating into the transistors thereon, and to improve the bonding strength between the substrate 10 and the upper film layers.

In the present embodiment, each pixel driving circuit includes a compensation transistor 20 and a second thin film transistor 30 which are spaced apart from each other. The compensation transistor 20 includes a first semiconductor layer 21 located on the substrate 10, a first gate layer 22 located above the first semiconductor layer 21, and a first source/drain layer 23 located on the first gate layer 22. The second thin film transistor 30 includes a second semiconductor layer 31 located on the substrate 10, a second gate layer 32 located above the second semiconductor layer 31, and a second source/drain layer 34 located on the second gate layer 32.

In the present embodiment, the first semiconductor layer 21 and the second semiconductor layer 31 are disposed on the same layer and spaced apart from each other. The first gate layer 22 and the second gate layer 32 are disposed on the same layer and spaced apart from each other. The first source/drain layer 23 and the second source/drain layer 34 are disposed on the same layer and spaced apart from each other. The material of the first semiconductor layer 21 includes but not limited to oxide. The material of the second semiconductor layer 31 includes but not limited to monocrystalline silicon or polycrystalline silicon. The first semiconductor layer 21 forms an oxide semiconductor layer of each of the oxide transistors, and the second semiconductor layer 31 forms a polycrystalline silicon semiconductor layer of each of the low-temperature polycrystalline silicon transistors.

It can be understood that since the silicon material has relatively high electron mobility and therefore has low energy consumption and excellent reliability, the polysilicon semiconductor layer thin film transistors can be applied to the thin film transistors of the pixel driving circuit. The oxide semiconductor material has a lower cut-off current than that of the silicon material. Therefore, the oxide semiconductor thin film transistor can be applied to the switching thin film transistors with short conducting time and long cut-off time. Moreover, since the cut-off current is small and the size of the auxiliary capacitor can be reduced, the oxide semiconductor thin film transistor is suitable for high-resolution display devices.

Further, in the present embodiment, the pixel driving circuit layer includes a first metal layer 610, a second metal layer 620, a third metal layer 630, and a fourth metal layer 640 which are stacked on the substrate 10 in order. The first metal layer 610 includes the first gate layer 22, the second gate layer 32, and a first capacitor electrode (not shown in the figure). The second metal layer 620 includes a second capacitor electrode 33. The third metal layer 630 includes the first source/drain layer 23 and the second source/drain layer 34. The fourth metal layer 640 includes a bridge layer 100.

It should be noted that in the present embodiment, the first gate layer 22, the second gate layer 32, and the first capacitor electrode are formed by the same metal block, and they are located in different areas of the same metal block. The first capacitor electrode and the second capacitor electrode 33 form the first capacitor Cst.

In the present embodiment, the materials of the first metal layer 610, the second metal layer 620, the third metal layer 630, and the fourth metal layer 640 may include at least one metal of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), and tungsten (W).

In the present embodiment, the display panel further includes a shielding component 50 disposed between the substrate 10 and the compensation transistor 20, and an orthogonal projection of the shielding component 50 projected on the substrate 10 at least partially overlaps an orthogonal projection of the compensation transistor 20 projected on the substrate 10. Further, in the present embodiment, the orthogonal projection of the shielding component 50 projected on the substrate 10 overlaps the orthogonal projection of the compensation transistor 20 projected on the substrate 10.

In the present embodiment, the material of the shielding component 50 includes but not limited to one of amorphous silicon, polycrystalline silicon or oxide, and it is not limited in the present embodiment.

In the present embodiment, the shielding component 50 includes a first shielding layer 51 disposed between the substrate 10 and the first semiconductor layer 21. The first shielding layer 51 corresponds to the first gate layer 22, and the orthogonal projection of the first shielding layer 51 projected on the substrate 10 covers the orthogonal projection of the first semiconductor layer 21 projected on the substrate 10. That is, in the direction perpendicular to the substrate 10, the area of the first shielding layer 51 is greater than the area of the first semiconductor layer 21.

Optionally, the first shielding layer 51 is located between the first buffer layer 14 and the first flexible substrate 11 (as shown in FIG. 3A). Alternatively, the first shielding layer 51 is located between the first buffer layer 14 and the second buffer layer 15 (as shown in FIG. 3B). The present embodiment is not limited thereto.

It can be understood that in the present embodiment, the first shielding layer 51 is disposed between the compensation transistor 20 and the substrate 10, in which the first shielding layer 51 has a charge shielding effect, so that the compensation transistor 20 is not affected by the potential of the substrate 10. Moreover, the first shielding layer 51 corresponds to the first gate layer 22. The first shielding layer 51 forms a floating gate structure, and is only on the side of the compensation transistor 20 close to the substrate 10. The first shielding layer 51 functions as a data storage unit, which improves the reliability of the compensation transistor 20 during operation, so that the shift of the threshold voltage Vth of the second thin film transistor 30 in the pixel driving circuit is improved, thereby enhancing the current stability of the pixel driving circuit.

It should be noted that in the present embodiment, the first shielding layer 51 may have a single-layer or multi-layer structure. For example, in one embodiment, the first shielding layer may have a single-layer structure of molybdenum (Mo). In another embodiment, the first shielding layer 51 may have a multilayer structure. Specifically, the first shielding layer 51 includes a first layer of titanium (Ti), a second layer of aluminum (Al), and a third layer of titanium (Ti) which are stacked on the substrate 10. The present embodiment is not limited thereto.

In the present embodiment, the first semiconductor layer 21 includes a first channel region 213, a first doped region 211, and a second doped region 212. The first doped region 211 and the second doped region 212 are separated on both sides of the first channel region 213. The width of the first doped region 211 is equal to the width of the second doped region 212, and the width of the first channel region 213 is greater than the width of the first doped region 211 and the width of the second doped region 212. Specifically, the width of the first channel region 213 is greater than 5 microns.

In the present embodiment, the width of the first channel region 213 is greater than the widths of the first doped region 211 and the second doped region 212. By increasing the length of the first channel region 213 to make the widths of the first doped region 211 and the second doped region 212 smaller than the width of the first channel region 213, the resistance of the first channel region 213 is increased, so that the current flowing through the first channel region 213 is reduced, thereby achieving the improvement for the performance reliability of the thin film transistor.

In the present embodiment, the display panel further includes a third insulating layer 60 located between the first semiconductor layer 21 and the first metal layer 610, a fourth insulating layer 70 located between the first metal layer 610 and the second metal layer 620, an interlayer insulating layer 80 located between the second metal layer 620 and the third metal layer 630, a first planarization layer 90 located between the third metal layer 630 and the fourth metal layer 640, and other conventional film layers, such as a second planarization layer 110, a light-emitting function layer 40, a packaging layer 120, a touch layer 130, a polarizing layer 140, and a cover plate 150, located above the fourth metal layer 640. The light-emitting function layer 40 includes an anode 41, a pixel definition layer 42, a light-emitting layer 43, and a cathode 44 which are stacked on the second planarization layer 110. The light-emitting function layer 40 is electrically connected with the second source/drain layer 34 through the bridge layer 100.

Figure 4:
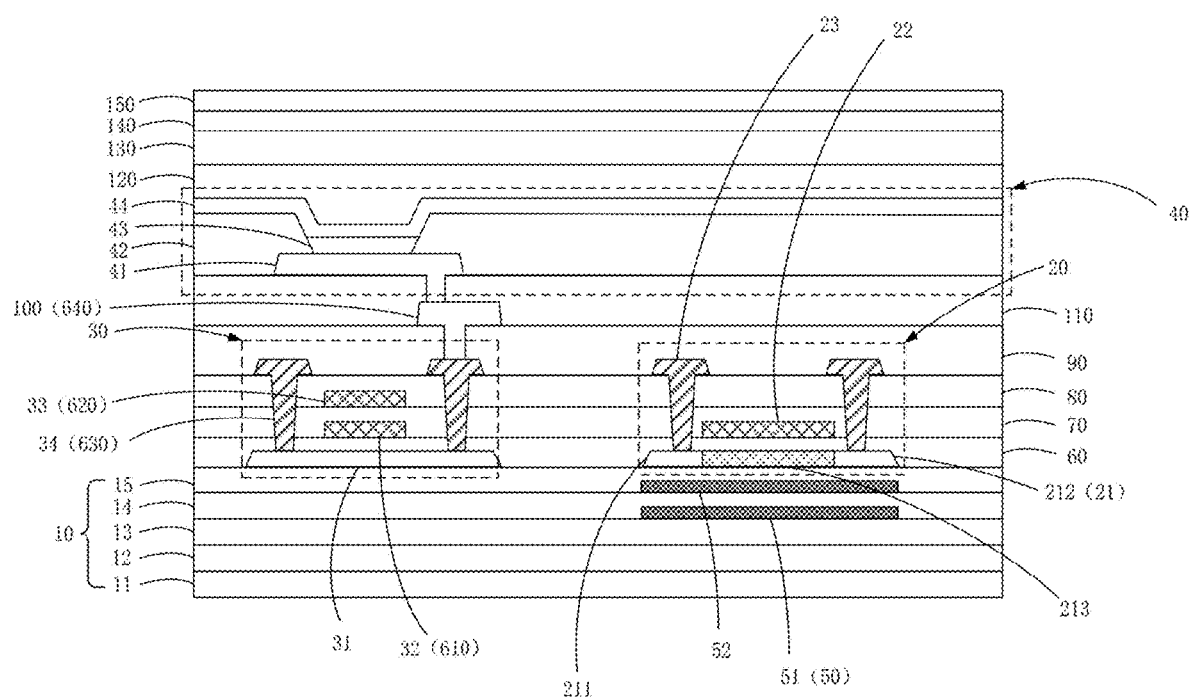
FIG. 4 is a second schematic structural diagram of a display panel disclosed in the embodiments of the present disclosure.

Reference is made to FIG. 4. A second schematic structural diagram of the display panel is disclosed in the embodiments of the present disclosure.

In the present embodiment, the structure of the display module is similar/equal to the first structure of the display module disclosed in the aforementioned embodiments. The specific details may refer to the description of the display module in the aforementioned embodiments, and the further description thereof is not given herein. The difference between the two is only that:

In the present embodiment, the shielding component 50 further includes a first insulating layer, a second shielding layer 52, and a second insulating layer which are located between the first shielding layer 51 and the first semiconductor layer 21. The orthogonal projection of the second shielding layer 52 projected on the substrate 10 overlaps the orthogonal projection of the first shielding layer 51 projected on the substrate 10. Further, the first insulating layer is the first buffer layer 14, and the second insulating layer is the second buffer layer 15. The first shielding layer 51 is located between the first buffer layer 14 and the first flexible substrate 11, and the second shielding layer 52 is located between the first buffer layer 14 and the second buffer layer 15.

It can be understood that in the present embodiment, the first shielding layer 51 and the second shielding layer 52 are disposed between the compensation transistor 20 and the substrate 10, so that the compensation transistor 20 is not affected by the potential of the substrate 10, which improves the reliability of the compensation transistor 20. As a result, the shift of the threshold voltage Vth of the compensation transistor 20 in the pixel driving circuit is improved, thereby enhancing the current stability of the pixel driving circuit.

Figure 5:
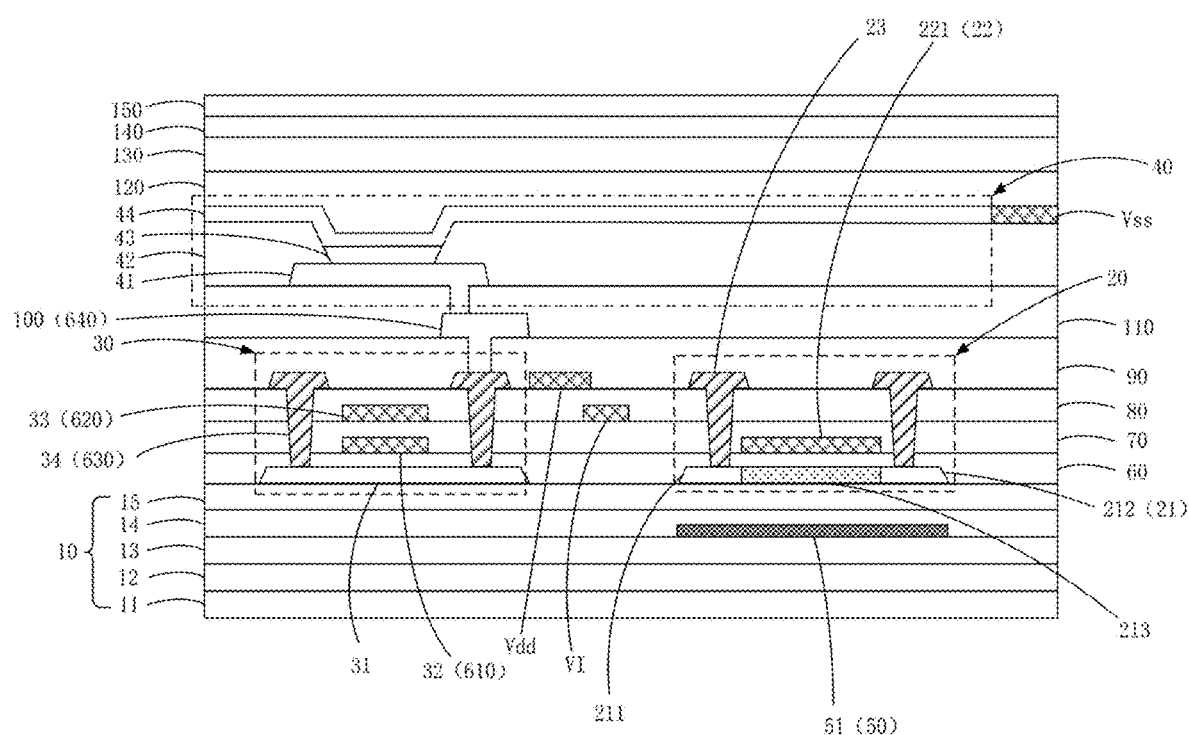
FIG. 5 is a third schematic structural diagram of a display panel disclosed in the embodiments of the present disclosure.

Reference is made to FIG. 5. A third schematic structural diagram of the display panel is disclosed in the embodiments of the present disclosure.

In the present embodiment, the structure of the display module is similar/equal to the first structure of the display module disclosed in the aforementioned embodiments. The specific details may refer to the description of the display module in the aforementioned embodiments, and the further description thereof is not given herein. The difference between the two is only that:

In the present embodiment, the material of the shielding component 50 is an electrical conductive material. The first shielding layer 51 is connected to receive a constant potential.

Specifically, the display panel further includes a reset metal line VI located between the second gate layer 32 and the second source/drain layer 34, a constant high-level voltage metal line Vdd disposed on the same layer with the second source/drain layer 34, a constant low-level voltage metal line Vss disposed on the same layer with the first gate layer 22, and a bridge component (not shown in the figure) located in a non-display area (not shown in the figure), in which one terminal of the bridge component is disposed on the same layer with and electrically connected to one of the reset metal line VI, the constant high-level voltage metal line Vdd, and the constant low-level voltage metal line Vss, and another terminal of the bridge component is electrically connected to the first shielding layer 51.

In the present embodiment, the shown first shielding layer 51 is connected to receive a constant potential, so that the first shielding layer 51 has a stable potential. When different voltages are applied from the bridge layer to the first shielding layer 51, the compensation transistor 20 is not affected by the potential of the substrate 10, which improves the reliability of the compensation transistor 20, thereby improving the shift of the threshold voltage Vth of the compensation transistor 20 in the pixel driving circuit and enhancing the current stability of the pixel driving circuit. Moreover, the substrate 20 is provided with the first shielding layer 51, of which the orthogonal projection projected on the substrate 20 covers the orthogonal projection of the first semiconductor layer 21 projected on the substrate 10, so that the first shielding layer 51 can shield the charges induced by the substrate 10. Accordingly, the compensation transistor 20 is not affected by the potential of the substrate 10.

Figure 6:
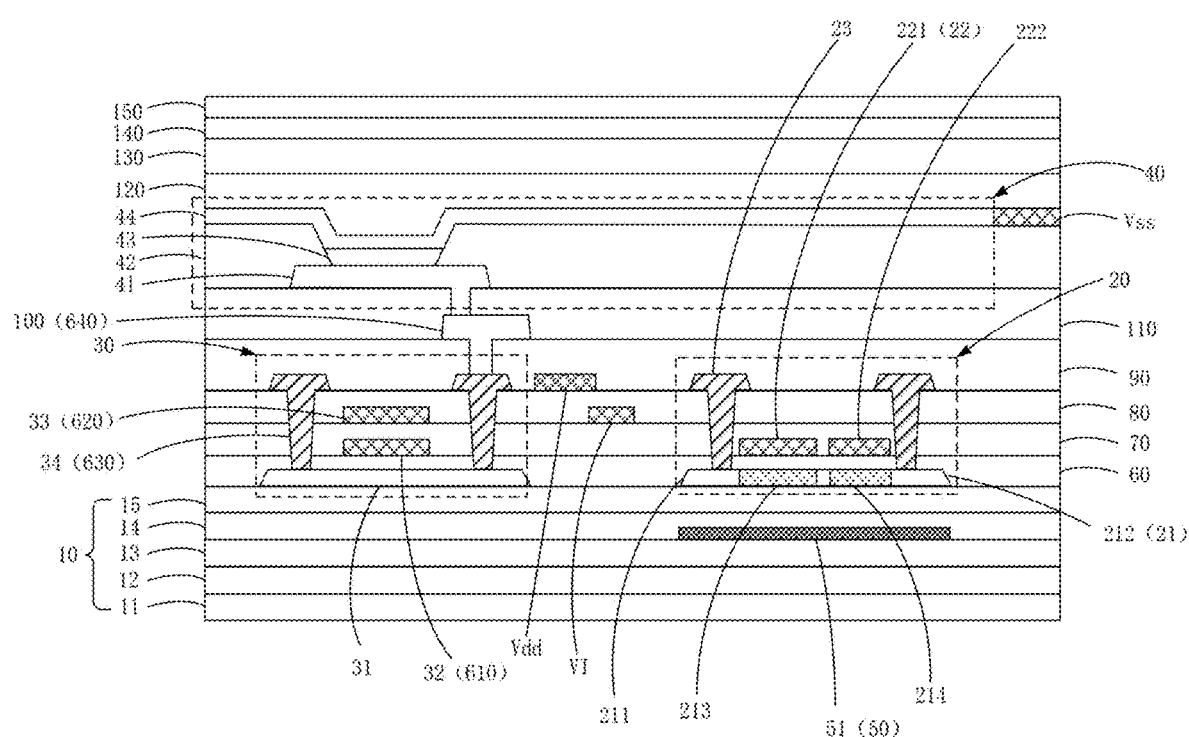
FIG. 6 is a fourth schematic structural diagram of a display panel disclosed in the embodiments of the present disclosure.
Figure 7:
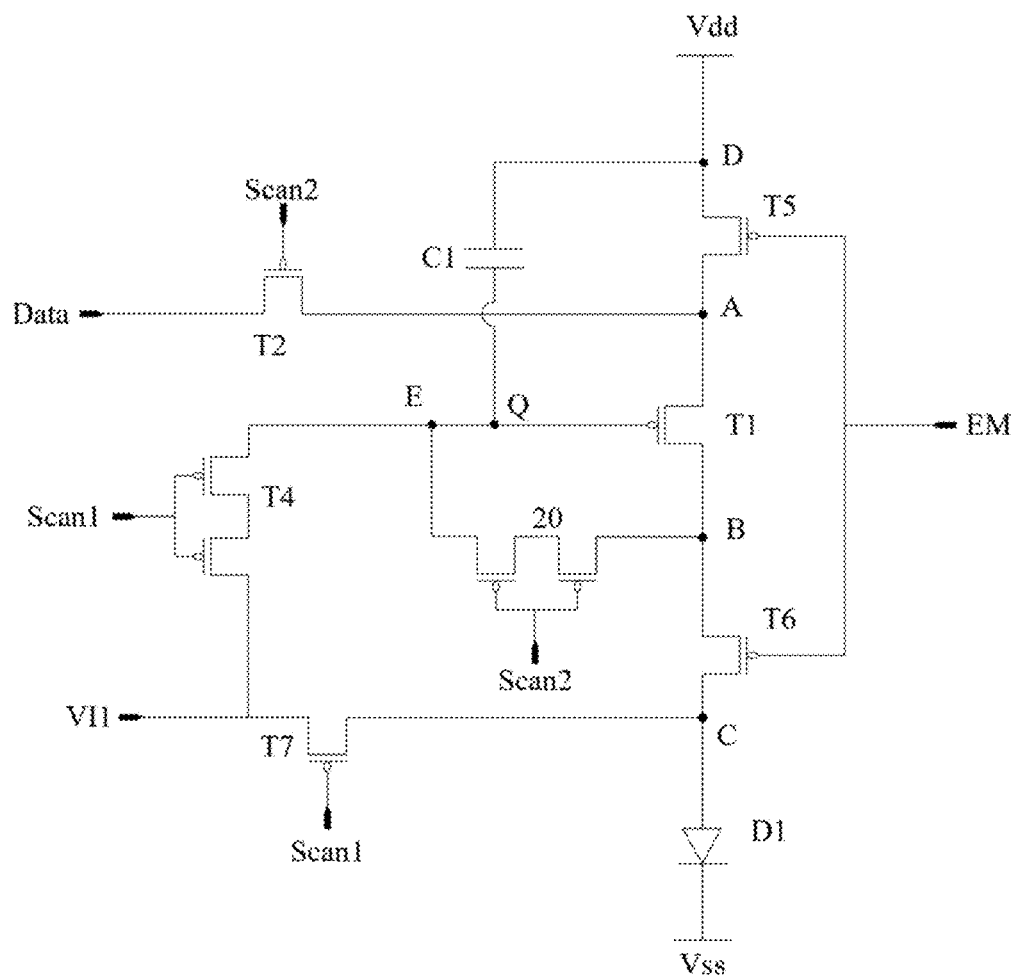
FIG. 7 is a schematic structural diagram of a pixel driving circuit of a display panel disclosed in the embodiments of the present disclosure.

References are made to FIG. 6 and FIG. 7. FIG. 6 is a fourth schematic structural diagram of the display panel disclosed in the embodiments of the present disclosure. FIG. 7 is a schematic structural diagram of a pixel driving circuit of a display panel disclosed in the embodiments of the present disclosure.

In the present embodiment, the structure of the display module is similar/equal to the first structure of the display module disclosed in the aforementioned embodiments. The specific details may refer to the description of the display module in the aforementioned embodiments, and the further description thereof is not given herein. The difference between the two is only that:

In the present embodiment, the compensation transistor 20 is a dule-gate structure. The first gate layer 22 includes a first gate 221 and a second gate 222 disposed on the same layer and spaced apart from each other. The orthogonal projections of the first gate 221 and the second gate 222 projected on the first semiconductor layer 21 are both located in the orthogonal projection of the first shielding layer 51 projected on the first semiconductor layer 21, and the first shielding layer 51 is electrically connected with at least one of the first gate 221 and the second gate 222.

In the present embodiment, the first semiconductor layer 21 includes a first channel region 213 and a second channel region 214. The first channel region 213 corresponds to the first gate 221, and the second channel region 214 corresponds to the second gate 222. The width of the second channel region 214 is ⅕ to ⅘ of the width of the first channel region 213. Further, the sum of the width of the first channel region 213 and the width of the second channel region 214 is greater than 5 microns.

It can be understood that in the present embodiment, the width of the second channel region 214 is ⅕ to ⅘ of the width of the first channel region 213. By increasing the length of the first channel region 213, the resistance of the first channel region 213 is increased, so that the current flowing through the first channel region 213 is reduced, thereby achieving the improvement for the performance reliability of the thin film transistor. It can be understood that the width of the second channel area 214 is not limited in the present embodiment, and the width of the second channel area 214 can be reduced within the allowable range of the process.

In the present embodiment, the display panel further includes a plurality of light-emitting units D1 disposed in an array. The pixel driving circuit drives the light-emitting unit D1 to emit light. The pixel driving circuit includes a first initialization transistor T4, a switching transistor T2, a driving transistor T1, a compensation transistor 20, a second initialization transistor T7, a first light-emitting control transistor T5, a second light-emitting control transistor T6, and the first capacitor Cst.

A gate of the driving transistor T1 is connected to the first node Q(E), a first terminal of the driving transistor T1 is connected to the third node B, and a second terminal of the driving transistor T1 is connected to the second node A.

A gate of the switching transistor T2 is connected to receive the second scanning signal Scan2, a first terminal of the switching transistor T2 is connected to receive the data signal Data, and a second terminal of the switching transistor T2 is connected to the second node A.

A gate of the compensation transistor 20 is connected to receive the second scanning signal Scan2, a first terminal of the compensation transistor 20 is connected to the third node B, and a second terminal of the compensation transistor 20 is connected to the first node Q(E).

A gate of the first initialization transistor T4 is connected to receive the first scanning signal Scan1, a first terminal of the first initialization transistor T4 is connected to receive the first initialization signal VI, and a second terminal of the first initialization transistor T4 is connected to the first node Q(E).

A gate of the first light-emitting control transistor T5 is connected to receive the light-emitting control signal EM, a first terminal of the first light-emitting control transistor T5 is connected to the fifth node D, and a second terminal of the first light-emitting control transistor T5 is connected to the second node A. The first light-emitting control transistor T5 is connected to the high-potential power signal line Vdd through the fifth node D.

A gate of the second light-emitting control transistor T6 is connected to receive the light-emitting control signal EM, a first terminal of the second light-emitting control transistor T6 is connected to the third node B, and a second terminal of the second light-emitting control transistor T6 is connected to the fourth node C.

A gate of the second initialization transistor T7 is connected to receive the second scanning signal Scan2, a first terminal of the second initialization transistor T7 is connected to the fourth node C, and a second terminal of the second initialization transistor T7 is connected to receive the first initialization signal VI.

A first capacitor electrode of the first capacitor Cst is connected to the fifth node D, and a second capacitor electrode 33 of the first capacitor Cst is connected to the first node Q(E). The first capacitor CST is connected to a first power supply line through the fifth node D, wherein the first power supply line is the constant high-level voltage metal line Vdd.

An anode of the light-emitting unit D1 is connected to the fourth node C, and a cathode of the light-emitting unit D1 is connected to the second power supply line, wherein the second power supply line is the constant low-level voltage metal line Vss.

The shielding component 50 is located between the substrate and at least one of the first initialization transistor T4, the switching transistor T2, the compensation transistor 20, the second initialization transistor T7, the first light-emitting control transistor T5, and the second light-emitting control transistor T6, and the present embodiment is not limited thereto.

In the present embodiment, the second thin film transistor 30 is the driving transistor T1. Furthermore, in the present embodiment, the compensation transistor 20 and the first initialization transistor T4 have the dual-gate structure. It can be understood that in the present embodiment, the compensation transistor 20 and the first initialization transistor T4 adopt the dual-gate structure, so that the risk of current leakage in the compensation transistor 20 and the first initialization transistor T4 is lowered, thereby improving the reliability of thin film transistor devices and circuits.

A mobile terminal is further disclosed in the embodiments of the present disclosure, wherein the mobile terminal includes any of the aforementioned display panels and a terminal body, and the terminal body and said display panel are combined into one.

The specific structures of said display panel may refer to the description of any of the display panels in the aforementioned embodiments, and the further description thereof is not given herein.

In the present embodiment, the terminal body may include a mid-frame, sealant, etc., which is not limited therein.

A display panel and a mobile terminal are disclosed in the embodiments of the present disclosure. The display panel includes a substrate and a pixel driving circuit layer disposed on the substrate. The pixel driving circuit layer includes a plurality of pixel driving circuits, and each of the pixel driving circuits at least includes a compensation transistor. The display panel further includes a shielding component disposed between the substrate and the compensation transistor. An orthogonal projection of the shielding component projected on the substrate at least partially overlaps an orthogonal projection of the compensation transistor projected on the substrate, so that the compensation transistor is not affected by a potential of the substrate, thereby enhancing the stability of the currents of the pixel driving circuits.

It can be understood that for one of ordinary skill in the art, equivalent replacements or changes can be made according to the technical solutions and the invention concept of the present disclosure, and all these changes or replacements shall fall within the scope of the following claims of the present disclosure.

What is claimed is:

1. A display panel comprising a substrate and a pixel driving circuit layer disposed on the substrate, wherein the pixel driving circuit layer comprises a plurality of pixel driving circuits, and each of the pixel driving circuits at least comprises a compensation transistor;

wherein the display panel further comprises a shielding component disposed between the substrate and the compensation transistor of each of the pixel driving circuits, and an orthogonal projection of the shielding component projected on the substrate at least partially overlaps an orthogonal projection of the compensation transistor of the each of the pixel driving circuits projected on the substrate;

wherein the compensation transistor of the each of the pixel driving circuits comprises a first semiconductor layer located on the substrate, a first gate layer located on the first semiconductor layer, and a first source/drain layer located on the first gate layer;

wherein the compensation transistor of the each of the pixel driving circuits is a dual-gate structure, the first gate layer comprises a first gate and a second gate disposed on a same layer and spaced apart from each other; and wherein the first semiconductor layer comprises a first channel region corresponding to the first gate and a second channel region corresponding to the second gate, and a sum of a width of the first channel region and a width of the second channel region is greater than or equal to 5 microns.

2. The display panel according to claim 1, wherein the shielding component comprises a first shielding layer disposed between the substrate and the first semiconductor layer.

3. The display panel according to claim 2, wherein a material of the shielding component is one of amorphous silicon, monocrystalline silicon, polycrystalline silicon, or oxide.

4. The display panel according to claim 3, wherein an orthogonal projection of the first shielding layer projected on the substrate covers an orthogonal projection of the first semiconductor layer projected on the substrate.

5. The display panel according to claim 3, wherein the shielding component further comprises a first insulating layer, a second shielding layer, and a second insulating layer which are located between the first shielding layer and the first semiconductor layer, and an orthogonal projection of the second shielding layer projected on the substrate covers an orthogonal projection of the first semiconductor layer projected on the substrate.

6. The display panel according to claim 2, wherein a material of the shielding component is an electrical conductive material; wherein the first shielding layer receives a constant potential.

7. The display panel according to claim 6, wherein the display panel further comprises a light-emitting function layer located on the pixel driving circuit layer, and the light-emitting function layer comprises an anode, a light-emitting layer, and a cathode which are stacked;

wherein the pixel driving circuit layer further comprises a second thin film transistor electrically connected with the light-emitting function layer, the second thin film transistor and the compensation transistor of the each of the pixel driving circuits are spaced apart from each other, the second thin film transistor comprises a second semiconductor layer, a second gate layer, and a second source/drain layer which are located on the substrate, and the second source/drain layer is electrically connected with the anode;

wherein the display panel further comprises a reset metal line located between the second gate layer and the second source/drain layer, and a constant high-level voltage metal line disposed on the same layer with the second source/drain layer.

8. The display panel according to claim 2, wherein orthogonal projections of the first gate and the second gate projected on the first semiconductor layer are both located in an orthogonal projection of the first shielding layer projected on the first semiconductor layer, and the first shielding layer is electrically connected with at least one of the first gate and the second gate.

9. The display panel according to claim 1, wherein the width of the second channel region is ⅕ to ⅘ of the width of the first channel region.

10. The display panel according to claim 9, wherein the display panel further comprises a plurality of light-emitting units disposed in an array, the pixel driving circuits drive the light-emitting units to emit light, and one of the pixel driving circuits comprises a first initialization transistor, a switching transistor, a driving transistor, the compensation transistor of the each of the pixel driving circuits, a second initialization transistor, a first light-emitting control transistor, a second light-emitting control transistor, and a first capacitor;
wherein a gate of the driving transistor is connected with a first node, a first terminal of the driving transistor is connected with a third node, and a second terminal of the driving transistor is connected with a second node;
wherein a gate of the switching transistor is connected to receive a second scan signal, a first terminal of the switching transistor is connected to receive a data signal, and a second terminal of the switching transistor is connected with the second node;
wherein a gate of the compensation transistor of the each of the pixel driving circuits is connected to receive the second scan signal, a first terminal of the compensation transistor of the each of the pixel driving circuits is connected with the third node, and a second terminal of the compensation transistor of the each of the pixel driving circuits is connected with the first node;
wherein a gate of the first initialization transistor is connected to receive a first scan signal, a first terminal of the first initialization transistor is connected to receive a first initialization signal, and a second terminal of the first initialization transistor is connected with the first node;
wherein a gate of the first light-emitting control transistor is connected to receive a light-emitting control signal, a first terminal of the first light-emitting control transistor is connected with a fifth node, a second terminal of the first light-emitting control transistor is connected with the second node, and the first light-emitting control transistor is connected to receive a high-potential power signal line through the fifth node;
wherein a gate of the second light-emitting control transistor is connected to receive the light-emitting control signal, a first terminal of the second light-emitting control transistor is connected with the third node, and a second terminal of the second light-emitting control transistor is connected with a fourth node;
wherein a gate of the second initialization transistor is connected to receive the second scan signal, a first terminal of the second initialization transistor is connected with the fourth node, and a second terminal of the second initialization transistor is connected to receive the first initialization signal;

wherein a first capacitor electrode of the first capacitor is connected with the fifth node, a second capacitor electrode of the first capacitor is connected with the first node, and the first capacitor is connected with a first power supply line through the fifth node, wherein the first power supply line is the constant high-level voltage metal line;
wherein an anode of one of the light-emitting units is connected with the fourth node, and a cathode of the one of the light-emitting units is connected with a second power supply line;
wherein the shielding component is at least located between the substrate and one of the first initialization transistor, the switching transistor, the compensation transistor of the each of the pixel driving circuits, the second initialization transistor, the first light-emitting control transistor, and the second light-emitting control transistor.

11. A mobile terminal comprising a display panel and a terminal body, wherein the terminal body and the display panel are combined into one, the display panel comprises a substrate and a pixel driving circuit layer disposed on the substrate, the pixel driving circuit layer comprises a plurality of pixel driving circuits, and each of the pixel driving circuits at least comprises a compensation transistor;
wherein the display panel further comprises a shielding component disposed between the substrate and the compensation transistor of each of the pixel driving circuits, and an orthogonal projection of the shielding component projected on the substrate at least partially overlaps an orthogonal projection of the compensation transistor of the each of the pixel driving circuits projected on the substrate;
wherein the compensation transistor of the each of the pixel driving circuits comprises a first semiconductor layer located on the substrate, a first gate layer located on the first semiconductor layer, and a first source/drain layer located on the first gate layer;
wherein the compensation transistor of the each of the pixel driving circuits is a dual-gate structure, the first gate layer comprises a first gate and a second gate disposed on a same layer and spaced apart from each other; and
wherein the first semiconductor layer comprises a first channel region corresponding to the first gate and a second channel region corresponding to the second gate, and a sum of a width of the first channel region and a width of the second channel region is greater than or equal to 5 microns.

12. The mobile terminal according to claim 11, wherein the shielding component comprises a first shielding layer disposed between the substrate and the first semiconductor layer.

13. The mobile terminal according to claim 12, wherein a material of the shielding component is one of amorphous silicon, monocrystalline silicon, polycrystalline silicon, or oxide.

14. The mobile terminal according to claim 13, wherein an orthogonal projection of the first shielding layer projected on the substrate covers an orthogonal projection of the first semiconductor layer projected on the substrate.

15. The mobile terminal according to claim 13, wherein the shielding component further comprises a first insulating layer, a second shielding layer, and a second insulating layer which are located between the first shielding layer and the first semiconductor layer, and an orthogonal projection of the second shielding layer projected on the substrate covers an orthogonal projection of the first semiconductor layer projected on the substrate.

16. The mobile terminal according to claim 12, wherein a material of the shielding component is an electrical conductive material; wherein the first shielding layer receives a constant potential.

17. The mobile terminal according to claim 16, wherein the display panel further comprises a light-emitting function layer located on the pixel driving circuit layer, and the light-emitting function layer comprises an anode, a light-emitting layer, and a cathode which are stacked;
wherein the pixel driving circuit layer further comprises a second thin film transistor electrically connected with the light-emitting function layer, the second thin film transistor and the compensation transistor of the each of the pixel driving circuits are spaced apart from each other, the second thin film transistor comprises a second semiconductor layer, a second gate layer, and a second source/drain layer which are located on the substrate, and the second source/drain layer is electrically connected with the anode;
wherein the display panel further comprises a reset metal line located between the second gate layer and the second source/drain layer, and a constant high-level voltage metal line disposed on the same layer with the second source/drain layer.

18. The mobile terminal according to claim 12, wherein orthogonal projections of the first gate and the second gate projected on the first semiconductor layer are both located in an orthogonal projection of the first shielding layer projected on the first semiconductor layer, and the first shielding layer is electrically connected with at least one of the first gate and the second gate.

19. The mobile terminal according to claim 11, wherein the width of the second channel region is $1/5$ to $4/5$ of the width of the first channel region.

20. The mobile terminal according to claim 19, wherein the display panel further comprises a plurality of light-emitting units disposed in an array, the pixel driving circuits drive the light-emitting units to emit light, and one of the pixel driving circuits comprises a first initialization transistor, a switching transistor, a driving transistor, the compensation transistor of the each of the pixel driving circuits, a second initialization transistor, a first light-emitting control transistor, a second light-emitting control transistor, and a first capacitor;
wherein a gate of the driving transistor is connected with a first node, a first terminal of the driving transistor is connected with a third node, and a second terminal of the driving transistor is connected with a second node;
wherein a gate of the switching transistor is connected to receive a second scan signal, a first terminal of the switching transistor is connected to receive a data signal, and a second terminal of the switching transistor is connected with the second node;
wherein a gate of the compensation transistor of the each of the pixel driving circuits is connected to receive the second scan signal, a first terminal of the compensation transistor of the each of the pixel driving circuits is connected with the third node, and a second terminal of the compensation transistor of the each of the pixel driving circuits is connected with the first node;
wherein a gate of the first initialization transistor is connected to receive a first scan signal, a first terminal of the first initialization transistor is connected to receive a first initialization signal, and a second terminal of the first initialization transistor is connected with the first node;
wherein a gate of the first light-emitting control transistor is connected to receive a light-emitting control signal, a first terminal of the first light-emitting control transistor is connected with a fifth node, a second terminal of the first light-emitting control transistor is connected with the second node, and the first light-emitting control transistor is connected to receive a high-potential power signal line through the fifth node;
wherein a gate of the second light-emitting control transistor is connected to receive the light-emitting control signal, a first terminal of the second light-emitting control transistor is connected with the third node, and a second terminal of the second light-emitting control transistor is connected with a fourth node;
wherein a gate of the second initialization transistor is connected to receive the second scan signal, a first terminal of the second initialization transistor is connected with the fourth node, and a second terminal of the second initialization transistor is connected to receive the first initialization signal;
wherein a first capacitor electrode of the first capacitor is connected with the fifth node, a second capacitor electrode of the first capacitor is connected with the first node, and the first capacitor is connected with a first power supply line through the fifth node, wherein the first power supply line is the constant high-level voltage metal line;
wherein an anode of one of the light-emitting units is connected with the fourth node, and a cathode of the one of the light-emitting units is connected with a second power supply line;
wherein the shielding component is at least located between the substrate and one of the first initialization transistor, the switching transistor, the compensation transistor of the each of the pixel driving circuits, the second initialization transistor, the first light-emitting control transistor, and the second light-emitting control transistor.

* * * * *